(12) United States Patent
Asakura

(10) Patent No.: US 9,648,763 B2
(45) Date of Patent: May 9, 2017

(54) ELECTRONIC APPLIANCE UNIT INCLUDING A TERMINAL BLOCK HAVING A TERMINAL BLOCK-SIDE FALL RESTRAINT PORTIONS

(75) Inventor: Ken Asakura, Toyota (JP)

(73) Assignee: TOYOTA JIDOSHA KABUSHIKI KAISHA, Toyota-shi, Aichi (JP)

( * ) Notice: Subject to any disclaimer, the term of this patent is extended or adjusted under 35 U.S.C. 154(b) by 1046 days.

(21) Appl. No.: 13/881,926

(22) PCT Filed: Oct. 13, 2011

(86) PCT No.: PCT/IB2011/002412
§ 371 (c)(1),
(2), (4) Date: Jun. 25, 2013

(87) PCT Pub. No.: WO2012/056279
PCT Pub. Date: May 3, 2012

(65) Prior Publication Data
US 2013/0264866 A1 Oct. 10, 2013

(30) Foreign Application Priority Data
Oct. 28, 2010 (JP) .................. 2010-242787

(51) Int. Cl.
| | | |
|---|---|---|
| H05K 5/02 | (2006.01) | |
| H05K 5/00 | (2006.01) | |
| H05K 7/14 | (2006.01) | |
| B60R 16/03 | (2006.01) | |
| H01R 12/00 | (2006.01) | |

(52) U.S. Cl.
CPC .............. *H05K 5/02* (2013.01); *B60R 16/03* (2013.01); *H01R 9/093* (2013.01); *H05K 5/0069* (2013.01); *H05K 7/1432* (2013.01)

(58) Field of Classification Search
CPC .................................................. H05K 7/1428
USPC .................................................. 361/823, 824
See application file for complete search history.

(56) References Cited

U.S. PATENT DOCUMENTS 3,302,160 A * 1/1967 Nielsen .................... H01R 9/26
439/716
2009/0223695 A1 9/2009 Inoue et al.

FOREIGN PATENT DOCUMENTS

| CN | 101427615 A | 5/2009 | |
|---|---|---|---|
| EP | 2633745 B1 * | 12/2014 | .......... H05K 5/0069 |
| FR | 2882861 A1 * | 9/2006 | .............. H02B 1/50 |
| JP | 61-153377 U1 | 9/1986 | |
| JP | 2003-127802 A | 5/2003 | |
| WO | 2007/122468 A2 | 11/2007 | |

(Continued)

OTHER PUBLICATIONS

ZA9901135A Abstract.*
(Continued)

*Primary Examiner* — Fritz M Fleming
(74) *Attorney, Agent, or Firm* — Sughrue Mion, PLLC

(57) ABSTRACT

An electronic appliance unit (10), which is installed at an incline, includes: a case (12) provided with an opening (14) that permits access to the interior of the case; and a terminal block (20) that faces the opening. The terminal block (20) has a terminal block-side fall restraint portion (24) that extends upward from the lower side of the opening in a direction of the inclination to restrain foreign objects (50) from falling from the terminal block.

7 Claims, 5 Drawing Sheets

(56) References Cited

FOREIGN PATENT DOCUMENTS

ZA        9901135 A * 10/1999

OTHER PUBLICATIONS

Machine Translation for FR2882861 obtained from ESPACENET.*
English partial translation of Japanese Office Action issued in corresponding JP Patent Application No. 2010-242787 on Aug. 16, 2012.

* cited by examiner

ELECTRONIC APPLIANCE UNIT INCLUDING A TERMINAL BLOCK HAVING A TERMINAL BLOCK-SIDE FALL RESTRAINT PORTIONS

BACKGROUND OF THE INVENTION

1. Field of the Invention

The invention relates to an electronic appliance unit that includes a case provided with an opening that permits access to the inside thereof, and a terminal block that faces the opening provided within the case.

2. Description of Related Art

Generally, electronic components, such as control circuit boards, of electronic appliance units mounted in vehicles and the like, such as inverters and the like, are housed within a case. In some electronic appliance units, an opening that permits access to a terminal block housed within the case is formed in the case, that is, a so-called service hole.

For example, Japanese Patent Application Publication No. 2003-127802 (JP-A-2003-127802) describes a dust-proof and water-proof case for a vehicle in which the access opening is provided with a cover. The dust-proof and water-proof case is provided with a subsidiary cover that covers the access opening in order to prevent entrance of dust through the access opening and that is removed when an attachment component part is to be accessed. With the described case, the entry of foreign objects into the case of an electronic appliance unit may be prevented to a certain degree.

However, although the entrance of foreign objects can be prevented when the access opening is covered with the subsidiary cover, as described in JP-A-2003-127802, the entrance of foreign objects cannot be prevented when the subsidiary cover is removed from the access opening. In some cases, foreign electroconductive objects may enter the inside of the case and come in contact with electronic components provided within the case, such as a control circuit board or the like, and causes a functional fault due to short-circuit.

SUMMARY OF THE INVENTION

The invention provides an electronic appliance unit that effectively reduces the occurrence of malfunctions resulting from the entry of foreign objects to the interior of the electronic appliance unit through an opening.

An aspect of the electronic appliance unit of the invention relates to an electronic appliance unit that is installed with an inclination and that includes: a case provided with an opening that permits access to the interior of the case; and a terminal block facing the opening. In the electronic appliance unit, the terminal block includes a terminal block-side fall restraint portion that extends upward from a lower side of the opening in a direction of the inclination to restrain foreign objects from falling from the terminal block.

In the foregoing aspect of the invention, the case may be provided with a case-side fall restraint portion that extends from a peripheral edge of the opening toward the interior of the case. In the foregoing aspect, when the case may be installed at an incline such that an angle between an imaginary line defined by a distal end of the terminal block-side fall restraint portion and a distal end of the case-side fall restraint portion and a horizontal line is less than 90 degrees.

According to the foregoing aspect, since the terminal block-side fall restraint wall is provided, foreign objects that have entered through the opening are effectively restrained from falling onto a far inward side of the terminal block.

BRIEF DESCRIPTION OF THE DRAWINGS

Features, advantages, and technical and industrial significance of example embodiments of the invention will be described below with reference to the accompanying drawings, in which like numerals denote like elements, and wherein.

DETAILED DESCRIPTION OF EMBODIMENTS

An inverter 10 is an electronic appliance unit that may be mounted in, for example, an electric motor vehicle propelled only by an electric motor, or a hybrid car that employs both an electric motor and an internal combustion engine. The inverter 10 converts DC electric current into AC electric current.

The inverter 10 is covered by a box-shaped case 12 that is made of, for example, aluminum. Various components, such as, electronic circuit boards (not shown) and a terminal block 20, for example, may be housed within the case 12. The terminal block 20 includes terminals that connect to external component parts (e.g., an electric motor/generator, and the like). The terminal block 20 is fixed to the terminal block 20 on the upper side of the case 12. Control circuit boards and electric circuits, constructed by disposing electronic components, such as semiconductor elements and the like, on electronic circuit boards, may be provided at a far inward side of the terminal block 20.

Figure 1:
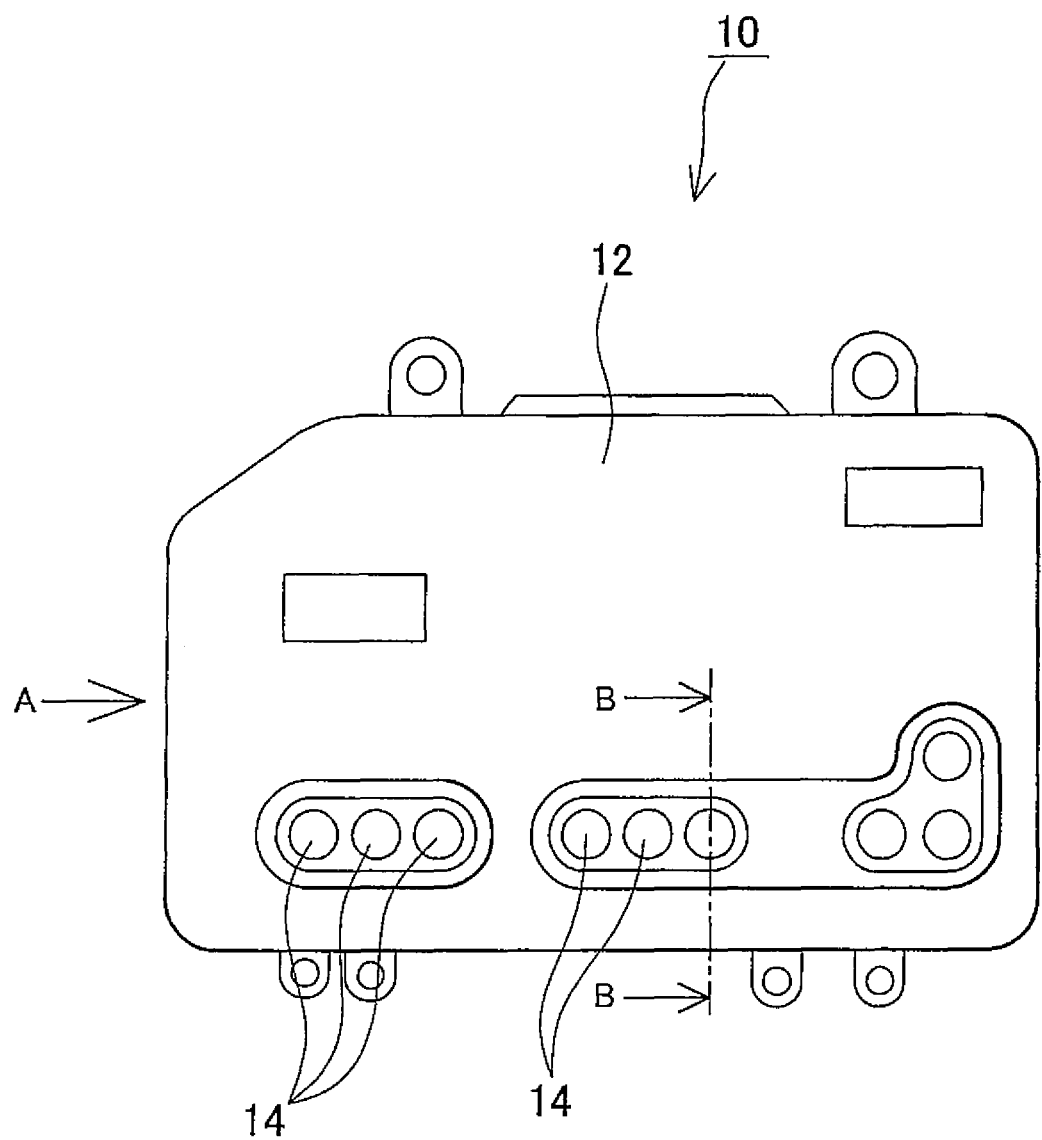
FIG. 1 is a schematic overhead view of an inverter that embodies the invention.
Figure 2:
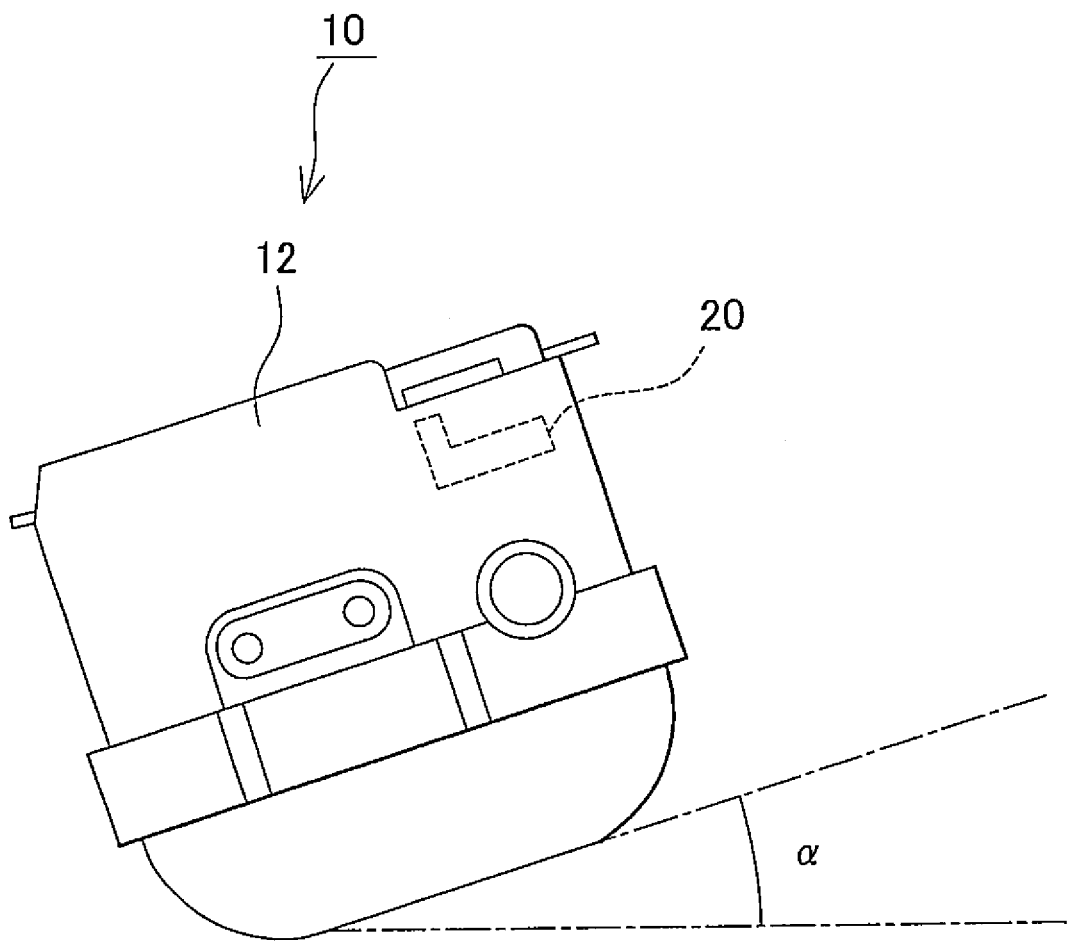
FIG. 2 is a view taken in a direction A in FIG. 1.

The inverter 10 is disposed within a vehicle at an incline, as shown in FIG. 2. Because the case 12 is thus disposed at an incline, the terminal block 20 and other components provided within the case 12 are also inclined.

At positions on the case 12 that face the terminal block 20, a plurality of service holes 14, through which an operator may access the terminal block 20, are formed. Incidentally, the service holes 14 may function as an opening in the invention. When an external component is to be connected to the inverter 10 by wire, the worker inserts his/her hand through an appropriate one of the service holes 14, and connects a cable for electrically connecting an external component part and the inverter 10 to a terminal on the terminal block 20.

The connection of the wire is performed via the service holes 14 for the following reason. Normally, the inverter 10 is assembled in a process or a factory that is separate from the vehicle assembly process, and is then delivered to the vehicle assembly process, where the inverter 10 is subjected to an assembly operation. Therefore, in order to restrain attachment of foreign objects to various electronic component parts provided inside the inverter 10 during transportation or the like, the inverter 10 is completely encased in the box-shape case 12 when supplied to the vehicle assembly process. However, once supplied to the vehicle assembly process, the inverter 10 needs to be wired to external component parts. In order to perform the wire-connection operation without removing the components of the inverter 10 from the case 12, the case 12 of the inverter 10 is generally formed with the service holes 14 for the wire-connection operation, that is. The service holes 14 are covered during transportation to prevent the entry of foreign objects through the service holes 14.

However, during the wiring operation, the service holes 14 are uncovered as a matter of course. Accordingly, foreign objects, such as dust or the like, may enter the interior of the inverter 10 through the service holes 14.

If the foreign object merely resides on the terminal block 20, substantially no problem is caused. However, as described above, normally the inverter 10 is installed at an incline, and therefore the terminal block 20 disposed inside the inverter 10 is also inclined. Accordingly, the foreign objects that fall onto the terminal block 20 sometimes slides off from the terminal block 20 and falls onto the far inward side of the terminal block 20. In addition, a foreign objects entering through the service hole 14 sometimes pass by the terminal block 20 and fall onto the far inward side of the terminal block 20.

Some foreign objects that have reached the far inward side of the terminal block 20 may contact electronic component parts, such as control circuit boards, that are disposed at the far inward side of the terminal block 20. If an electroconductive foreign object contacts an electronic component part, the object may cause short-circuit, which results in a malfunction of the inverter 10.

Therefore, in this embodiment, in order to minimize the occurrence of malfunctions due to contamination with foreign objects, a special structure is provided around the service holes 14 and the terminal block 20.

Figure 3:
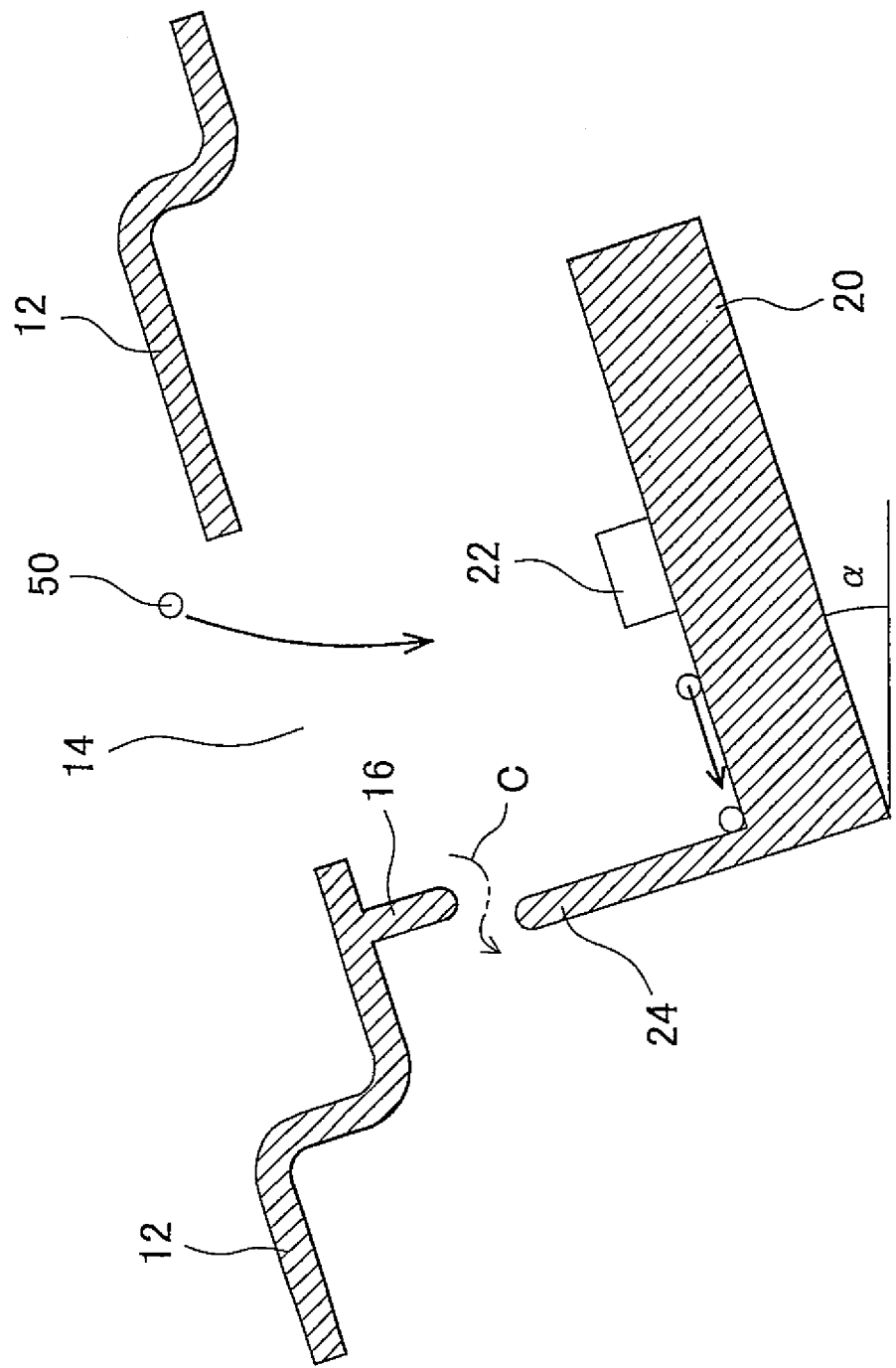
FIG. 3 is a schematic sectional view taken along line B-B in FIG. 1.

As is apparent from FIG. 3, in this embodiment, the service holes 14 are formed in the upper surface of the case 12, and the terminal block 20 on which terminals 22 are disposed at positions that correspond to the service holes 14 is installed. The terminal block 20 is fixed within the case 12 so that it is parallel to the upper surface of the case 12. Therefore, if the case 12 is installed at an incline of an angle α as shown in FIG. 2, the terminal block 20 will also be inclined at the angle α as well.

In this embodiment, a terminal block-side fall restraint wall 24 is formed at an end portion of a lower side of the terminal block 20 in an inclination direction (i.e., a side that comes to a lower side when the inverter 10 is installed with an inclination, that is, a left lower side in FIG. 3). The terminal block-side fall restraint wall 24 extends from the upper surface of the terminal block 20 toward the upper surface of the case 12 that faces the terminal block 20. Foreign objects 50 that fall onto the terminal block 20, and then slide downward along the terminal block 20, finally come into contact with the terminal block-side fall restraint wall 24. Thus, foreign objects from sliding and falling off from the terminal block 20 and are thereby prevented from contacting any of the electronic component parts positioned at the far inward side of the terminal block 20. The terminal block-side fall restraint wall 24 serves as the terminal block-side fall restraint portion in the invention.

Besides, in the embodiment, at least a portion of a periphery of each service hole 14 which is near a lower-side edge portion of the hole in the direction of inclination is provided with a case-side fall restraint wall 16 that extends there from toward the terminal block 20. The provision of the case-side fall restraint walls 16 effectively restrains foreign objects that have entered through the service holes 14 from moving downward in the direction of inclination, so that the foreign objects are restrained from contacting various electronic components positioned at the far inward side of the terminal block 20. The case-side fall restraint wall 16 serves as the case-side fall restraint portion in the invention.

In the embodiment, in order to more effectively restrain foreign objects from falling onto the far inward side of the terminal block 20, each terminal block-side fall restraint wall 24 is positioned below a corresponding service hole 14 in the direction of inclination. Specifically, in this embodiment, the terminal block 20 is positioned with the case 12 so that each terminal block-side fall restraint wall 24 is positioned farther outward from the edge of a service hole 14 than the corresponding case-side fall restraint walls 16.

Foreign objects that have entered through one of the service holes 14 cannot reach the far inward side of the terminal block 20 unless the foreign object moves in a maze-like route C that involves up-down movements, that is, a route in which the foreign object passes under the case-side fall restraint wall 16, and then passes over the terminal block-side fall restraint wall 24. That is, a labyrinth function is accomplished between the terminal block 20 and the case 12. Accordingly, the entry of foreign objects beyond the terminal block 20 is more effectively restrained.

Figure 4:
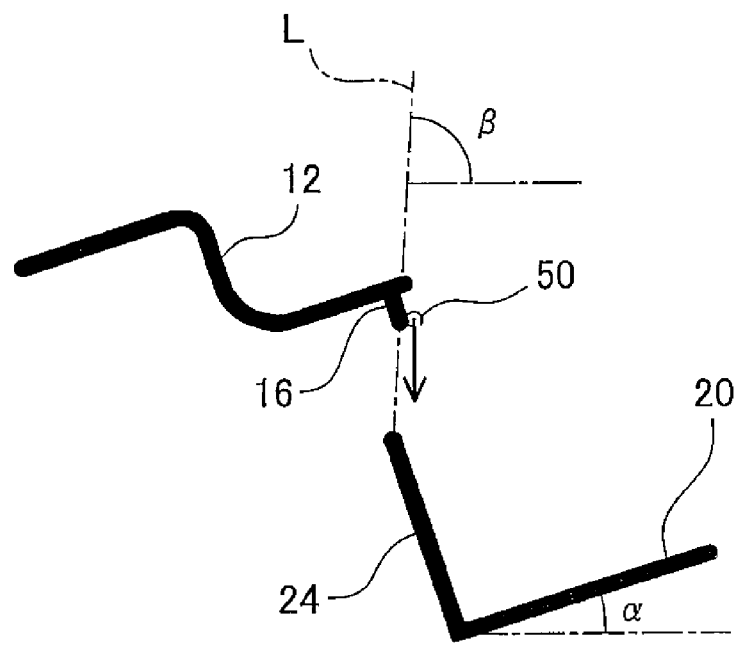
FIG. 4 is a schematic view showing the relative angle between a case-side fall restraint wall and a terminal block-side fall restraint wall in accordance with the embodiment of the invention.
Figure 5:
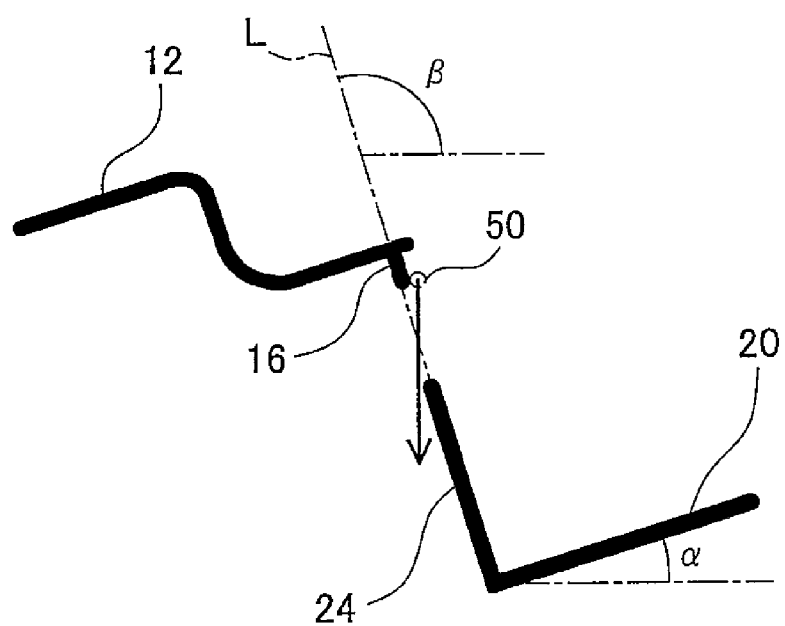
FIG. 5 is a schematic diagram showing the relative angle between a case-side fall restraint wall and a terminal block-side fall restraint wall according to a comparative example.

Herein, the relative angle between the case-side fall restraint walls 16 and the terminal block-side fall restraint walls 24 will be described in detail with reference to FIG. 4 and FIG. 5. FIG. 4 is a schematic diagram showing the relative angle between a case-side fall restraint wall 16 and a corresponding terminal block-side fall restraint wall 24.

In this embodiment, in order to effectively restrain fall of foreign objects, the case-side fall restraint wall 16 and the corresponding terminal block-side fall restraint wall 24 are positioned so that the angle β formed between a horizontal line and an imaginary line L defined by the distal end of the case-side fall restraint wall 16 and the distal end of the terminal block-side fall restraint wall 24 is less than 90 degrees. That is, as shown in FIG. 5, if the angle β formed between a horizontal line and the straight line L is greater than or equal to 90 degrees, foreign objects 50 that fall vertically down from the distal end of the case-side fall restraint wall 16 falls directly onto the far inward side of the terminal block 20 without striking or contacting the terminal block-side fall restraint wall 24. In this case, as stated above, a fault, such as the short-circuit caused by an electroconductive foreign object, may occur.

In contrast, if the angle β between a horizontal line and the straight line L is less than 90 degrees, the foreign object 50 that falls vertically down from the distal end of the case-side fall restraint wall 16 always strikes the terminal block-side fall restraint wall 24 or falls onto the near outward side of the terminal block-side fall restraint wall 24 (the upper side thereof in the direction of inclination). As a result, the foreign object 50 is effectively restrained from falling off from the terminal block 20.

Figure 6:
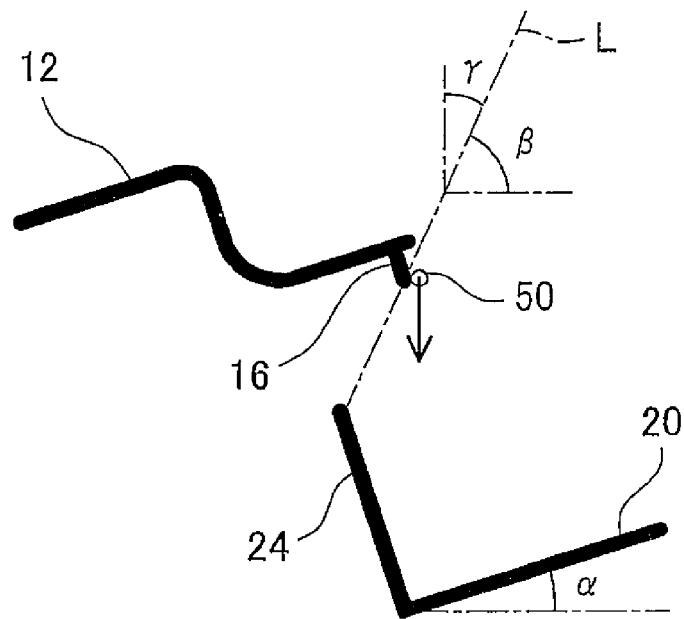
FIG. 6 is a schematic diagram showing a relative angle between a case-side fall restraint wall and a terminal block-side fall restraint wall in accordance with a second embodiment of the invention.

In some cases, the angle β may be reduced excessively because of restrictions in design, such as the size of the inverter 10 and the like. However, in order to restrain foreign objects from falling onto the far inward side of the terminal block 20, the angle β is more suitable the smaller it is. In order to maximize the fall restraint while meeting the restrictions in design, the angle β is preferable less than or equal to (90−α) degrees (where a is the angle of inclination of the inverter 10, e.g., see FIG. 2.). That is, it is desirable that an angle γ formed between a vertical line and a straight line L that connects the distal ends of the two walls 16 and 24 be greater than the inclination angle α of the inverter 10 set at the time of installation thereof, as shown in FIG. 6. This configuration more effectively restrain foreign objects from falling onto the far inward side of the terminal block 20.

Figure 7:
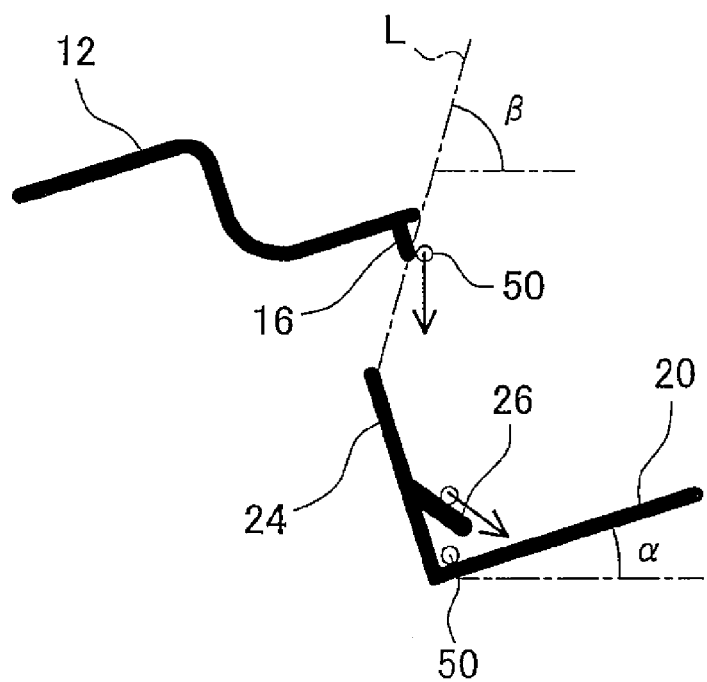
FIG. 7 is a schematic diagram showing a relative angle between a case-side fall restraint wall and a terminal block-side fall restraint wall in accordance with a third embodiment of the invention.

In order to restrain foreign objects remaining on the terminal block 20 from flying up, due to vibration or the like, and passing over the terminal block-side fall restraint wall 24, the terminal block-side fall restraint wall 24 may be provided with a fly-up restraint wall. That is, as shown in FIG. 7, a side surface of the terminal block-side fall restraint wall 24 may further include a wall that extends further downward the farther apart from the side surface of the terminal block-side fall restraint wall 24 it is. If a fly-up restraint wall 26 is provided, even if foreign objects remaining on the terminal block 20 fly up, the foreign object strikes the fly-up restraint wall 26 before passing over the terminal block-side fall restraint wall 24, so that the foreign objects remain on the terminal block 20 in the end. The fly-up restraint wall 26 may serve as a fly-up restraint portion in the invention.

Although the inverter 10 is mounted in a vehicle in the described embodiment, the invention may also be applied to electronic appliance units other than an inverter, as long as the electronic appliance unit includes a case that includes an opening for accessing the interior of the case, a terminal block that faces the opening, and is disposed at an incline. In addition, although each terminal block-side fall restraint wall 24 according to the above-described embodiment is provided at an end portion of the terminal block 20, the position of each terminal block-side fall restraint wall 24 may be positioned elsewhere as long as each terminal block-side fall restraint wall 24 is positioned at a lower side of a corresponding service hole 14 in the direction of inclination.

The invention claimed is:

1. An electronic appliance unit that is installed at an incline, the electronic appliance unit comprising:

a case provided a surface having an opening that permits access to the interior of the case; and
a terminal block facing the opening,
wherein the terminal block has a first side and a second side opposite to the first side in a horizontal direction, and the terminal block is inclined such that the first side is higher than the second side in a vertical direction,
wherein the terminal block includes a terminal block-side fall restraint portion that extends upward from an upper surface of the terminal block towards the surface of the case having the opening and in a direction of the inclination to restrain foreign objects that have fallen onto the terminal block from falling from the terminal block,
wherein the terminal block-side fall restraint portion is provided at a position closer to the second side than a straight line that is perpendicular to the upper surface of the terminal block and that passes through a lowest side of the opening.

2. The electronic appliance unit according to claim 1, wherein the case further comprises a case-side fall restraint portion that extends from a peripheral edge of the opening toward the interior of the case.

3. The electronic appliance unit according to claim 2, wherein the case is installed at an incline such that an angle between an imaginary line defined by a distal end of the terminal block-side fall restraint portion and a distal end of the case-side fall restraint portion and a horizontal line is less than 90 degrees.

4. The electronic appliance unit according to claim 1, wherein the terminal block-side fall restraint portion is provided with a fly-up restraint portion that extends from a side surface of the terminal block-side fall restraint portion and extends further downward as extension of the fly-up restraint portion becomes more apart from the side surface of the terminal block-side fall restraint portion.

5. The electronic appliance unit according to claim 1, wherein the terminal block is fixed within the case so that the terminal block is parallel to the upper surface of the case.

6. The electronic appliance unit according to claim 1, wherein the electronic appliance unit is an inverter.

7. The electronic appliance unit according to claim 1, wherein the electronic appliance unit is mounted in a vehicle.

* * * * *